Dec. 11, 1951 H. SUSSMAN 2,578,613
SECOND AND THIRD HARMONIC GENERATOR
Filed Jan. 24, 1947
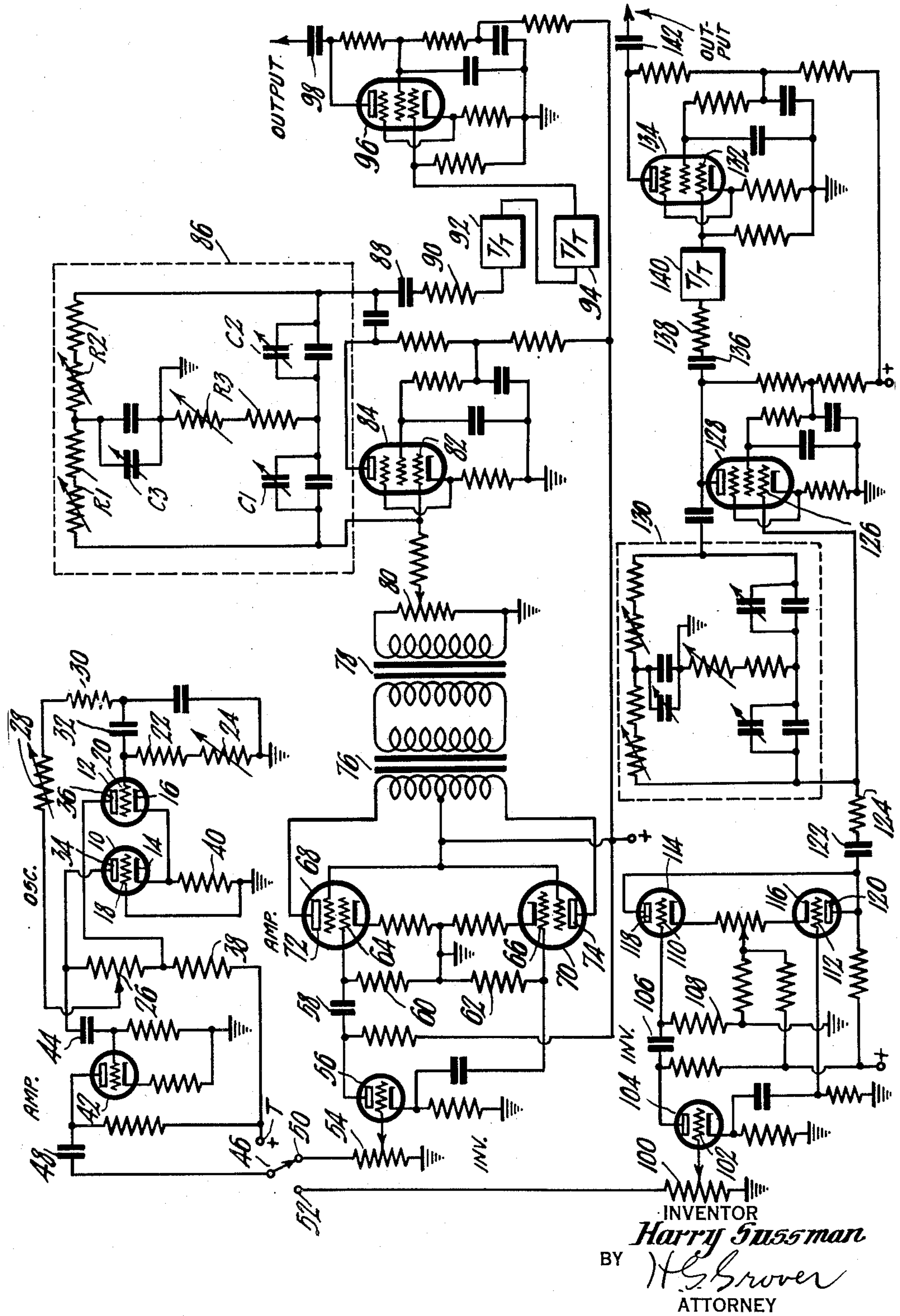
INVENTOR
Harry Sussman
BY H. G. Grover
ATTORNEY Patented Dec. 11, 1951

2,578,613

UNITED STATES PATENT OFFICE 2,578,613

SECOND AND THIRD HARMONIC GENERATOR

Harry Sussman, Great Neck, N. Y., assignor to Radio Corporation of America, a corporation of Delaware Application January 24, 1947, Serial No. 724,203

7 Claims. (Cl. 250—36)

This invention relates to harmonic generators and more particularly to harmonic generators of the type in which a plurality of harmonics are produced and amplified in separate channels.

It is well known in the art that with suitably chosen circuit components electronic oscillators can be designed which will produce stable oscillations of a desired frequency which will be rich in harmonic content. Attempts have been made in the past to utilize such oscillators for generating a multiplicity of harmonics and to provide separate channels for certain harmonics. Arrangements have been made whereby each such channel is provided with one or more amplifiers and filter circuits to accentuate the desired harmonics.

Such prior systems have had the disadvantage that spurious and undesired harmonics have been present in the output. Efforts to eliminate undesired frequencies have attained success only at the expense of the output of the desired frequency.

It is an object of this invention to provide an improved harmonic generator. It is another object of this invention to provide a device which will produce in separate channels relatively pure harmonics of a given frequency.

According to the present invention, an improved system has been provided in which the harmonics of a stable oscillator are directed into separate channels. In one of these channels a push-pull amplifier is included to drive a saturated core transformer the output of which is fed to an amplifier degenerative at all frequencies but the desired harmonic. In another of these channels the oscillator output is fed to a phase inverter and then to an amplifier whose grids are 180° out of phase and whose plates are in parallel. A similar degenerative amplifier is provided in this latter channel to amplify only the second harmonic.

These and other objects will become apparent from a consideration of the following detailed description when taken in connection with the accompanying drawing which represents schematically a preferred embodiment of the invention.

Referring to the drawing it will be seen that there has been provided an electronic oscillator comprising a pair of tubes 10 and 12 having their cathodes 14 and 16 connected together. Grid 20 of tube 12 is connected to ground through biasing resistors 22 and 24. By means of potentiometer 26 a portion of the output of tubes 10 and 12 is fed back to the input through resistors 28 and 30 and condenser 32 in proper phase to establish sustained oscillations. A positive voltage is supplied to the plates 34 and 36 of tubes 10 and 12 from terminal T through resistor 38. Tubes 10 and 12 are self-biased by means of resistor 40 connected between their cathodes and ground.

It will be seen there has thus been provided a stable oscillator of the phase shift type. Because of its high inherent frequency stability this type of oscillator is preferable, although it will be clear that any type of stable oscillator having comparable characteristics may be used without departing from the spirit of the invention.

In order to prevent the later stages from reacting with the oscillator and thus interfering with its stability there is provided an isolating amplifier 42 to decouple the oscillator from its driven circuits. The output from the oscillator is fed to the isolating amplifier through condenser 44. The isolating amplifier 42 may be of any conventional type so long as it is capable of amplifying the frequencies fed to it without discrimination.

The output from amplifier 42 is fed to switch 46 through condenser 48. Switch 46 is arranged to deliver the output from amplifier 42 to either contact 50 or contact 52.

Considering switch 46 to be in the position shown, the oscillations are fed through potentiometer 54 to a phase inverter 56 of standard construction. The output of inverter 56 is fed through condenser 58 and resistors 60 and 62 to the grids 64 and 66 of a pair of amplifying tubes 68 and 70 in push-pull relationship. Plates 72 and 74 of tubes 68 and 70 feed the amplified output into transformer 76. As is known in the art, such push-pull amplifiers amplify the fundamental and odd harmonics with minimum second harmonic distortion.

The push-pull amplifier just described performs the further function of furnishing the required power level for operating the saturated core transformer 78. The amplifier supplies alternating current to the primary of this transformer at a sufficiently high voltage to cause saturation of its magnetic circuit during both halves of the alternating current wave. As a result the voltage induced in the secondary will be distorted. The use of a push-pull circuit results in the cancellation of the even harmonics. The resultant output wave shape from the saturated transformer is thus rich in harmonics, particularly the third.

The output from transformer 78 is fed through potentiometer 80 to grid 82 of the degenerative amplifier 84. A portion of the output from amplifier 84 is fed back to its input through a resistance capacity bridge network represented within the box 86. Such circuit is known in the art as a parallel T Null network. Preferably the circuits are adjusted so that the series resistors $R_1$ and $R_2$ are each equal to twice the value of shunt resistor $R_3$. The series capacitors $C_1$ and $C_2$ are preferably of equal values and each equal to one-half the value of the shunt capacitor $C_3$. With this relationship the null frequency will be equal to the reciprocal of the quantity $2\pi R_1 C_1$. By thus suitably proportioning the resistors and capacitors, the amplifier is made to be degenerative at all frequencies other than the third harmonic component. While such a network is peculiarly well-adapted for this purpose, any filter network which will accomplish the desired results may be used.

The output from amplifier 84 is fed through condenser 88 and resistor 90 to a pair of "twin T" networks 92 and 94. These networks are designed to suppress any fundamental and second harmonic components still present in the output of the degenerative amplifier.

After passing through the "twin T" networks the amplified third harmonic is fed to an amplifier 96 where it is amplified and fed through condenser 98 to the output.

When the switch 46 is thrown so as to complete the circuit through contact 52 the output from amplifier 42 is fed through potentiometer 100 to the grid 102 of phase inverter 104. The output from the inverter 104 is fed through condenser 106 and resistor 108 and an unnumbered resistor to the grids 110 and 112 of amplifiers 114 and 116 in push-pull relationship. The plates 118 and 120 of amplifiers 114 and 116 are connected in parallel. By this arrangement, the grids 110 and 112 are driven out of phase, generating a strong second harmonic component. As a result the output frequency is doubled and the fundamental and all odd harmonics are neutralized. A further advantage results in that lower excitation is required.

The output of amplifiers 114 and 116 is fed through condenser 122 and resistor 124 to the grid 126 of a degenerative amplifier 128. A portion of the output of amplifier 128 is fed back through a resistance capacity network 130 to its grid in the same manner as in the case of degenerative amplifier 84. However, the circuit components of the bridge network are selected so that the amplifier is degenerative at all frequencies but the second harmonic components.

The output of amplifier 128 is fed to grid 132 of an amplifying tube 134 through condenser 136, resistor 138 and a "twin T" network 140. Network 140 is designed to reject any trace of the fundamental still present in the output of amplifier 128. The output from amplifier 134 is delivered to an output terminal through condenser 142.

It will be obvious to one skilled in the art that should it be desired to obtain the fourth harmonic it will be necessary only to insert a second phase inverter between the amplifier 128 and the bridge network 140 and the process of the first doubling section repeated, resulting in a strong fourth harmonic of the oscillator frequency. In such case the bridge network 140 would be designed to reject any traces of the fundamental and second harmonic still present in the output.

I claim as my invention:

1. A harmonic generator comprising an oscillator, an even harmonic suppressor coupled to the output of said oscillator, said suppressor consisting of an electronic amplifier having a push-pull output circuit, a saturable core transformer connected to the output of said suppressor, and a degenerative amplifier for amplifying the output of said transformer comprising an electronic amplifying device having a portion of its output fed back to its input through a frequency-responsive filter network so as to de-emphasize all frequencies but the third harmonic of the frequency of said oscillator.

2. A harmonic generator comprising an oscillator, an even harmonic suppressor coupled to the output of said oscillator, said suppressor consisting of an electronic amplifier having a push-pull output circuit, a degenerative amplifier for amplifying the output of said suppressor consisting of an electronic amplifying device having a portion of its output fed back to its input through a frequency-responsive filter network so as to de-emphasize all frequencies but the third harmonic of the frequency of said oscillator, and a third harmonic amplifier for amplifying the output from said degenerative amplifier.

3. A harmonic generator comprising an oscillator, an even harmonic suppressor coupled to the output of said oscillator, said suppressor consisting of an electronic amplifier having a push-pull output circuit, a saturable core transformer connected to the output of said suppressor, a degenerative amplifier for amplifying the output of said transformer comprising an electronic amplifying device having a portion of its output fed back to its input through a filter network so as to de-emphasize all frequencies but the third harmonic of the frequency of said oscillator, and a third harmonic amplifier for amplifying the output from said degenerative amplifier.

4. A harmonic generator comprising an oscillator, an even harmonic suppressor coupled to the output of said oscillator, said suppressor consisting of an electronic amplifier having a push-pull output circuit, a saturable core transformer connected to the output of said suppressor, a degenerative amplifier for amplifying the output of said transformer comprising an electronic amplifying device having a portion of its output fed back to its input through a filter network so as to de-emphasize all frequencies but the third harmonic of the frequency of said oscillator, a third harmonic amplifier for amplifying the output from said degenerative amplifier, and a filter network connected between said degenerative amplifier and said third harmonic amplifier to suppress the fundamental and second harmonic of the oscillator frequency.

5. A harmonic generator, comprising an oscillation generator, a first amplifier stage having input electrodes coupled to said generator, said amplifier stage having output electrodes, an output circuit coupled to said output electrodes and arranged to stress a selected harmonic of the fundamental frequency of said generator, a second amplifier stage having input electrodes in an input circuit coupled to said output circuit, said second stage having output electrodes coupled to an output circuit, and a frequency-responsive impedance network connected between the input and output electrodes of the second stage for feeding back a portion of the output of said second stage to its input, said network having impedance values such as to make said second stage degenerative at all frequencies other than that of said selected harmonic.

6. A harmonic generator as recited in claim 5 wherein the selected harmonic is the third harmonic.

7. A harmonic generator as recited in claim 5 wherein the selected harmonic is the second harmonic.

HARRY SUSSMAN.

REFERENCES CITED

The following references are of record in the file of this patent:

UNITED STATES PATENTS

| Number | Name | Date |
|---|---|---|
| 1,559,869 | Hartley | Nov. 3, 1925 |
| 1,592,937 | Jammer | July 20, 1926 |
| 1,678,199 | Rettenmeyer | July 24, 1928 |
| 1,765,606 | Ohl | June 24, 1930 |
| 1,851,408 | Runge | Mar. 29, 1932 |
| 1,885,728 | Keith | Nov. 1, 1932 |
| 2,070,958 | Peterson | Feb. 16, 1937 |
| 2,161,418 | Jones | June 6, 1939 |
| 2,162,806 | Fay | June 20, 1939 |
| 2,306,749 | Potter | Dec. 29, 1942 |